United States Patent
Sahota et al.

(10) Patent No.: US 6,613,646 B1
(45) Date of Patent: Sep. 2, 2003

(54) METHODS FOR REDUCED TRENCH ISOLATION STEP HEIGHT

(75) Inventors: Kashmir Sahota, Fremont, CA (US); Krishnashree Achuthan, San Ramon, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/106,005

(22) Filed: Mar. 25, 2002

(51) Int. Cl.[7] .............................................. H01L 21/76
(52) U.S. Cl. ...................... 438/424; 438/296; 438/437; 438/633; 438/689
(58) Field of Search ........................ 438/296, 424–426, 438/437, 633, 689

(56) References Cited

U.S. PATENT DOCUMENTS

| | | |
|---|---|---|
| 5,229,316 A | 7/1993 | Lee et al. |
| 5,674,773 A | 10/1997 | Koh et al. |
| 5,692,950 A | 12/1997 | Rutherford et al. |
| 5,923,993 A | 7/1999 | Sahota |
| 5,950,093 A | 9/1999 | Wei |
| 5,998,301 A | 12/1999 | Pham et al. |
| 6,004,862 A | 12/1999 | Kim et al. |
| 6,037,236 A | 3/2000 | Jang |
| 6,069,080 A | 5/2000 | James et al. |
| 6,080,635 A | 6/2000 | Jang et al. |
| 6,080,637 A * | 6/2000 | Huang et al. ............... 438/424 |
| 6,190,999 B1 | 2/2001 | Hung et al. |
| 6,217,418 B1 | 4/2001 | Lukanc et al. |
| 6,337,281 B1 | 1/2002 | James et al. |
| 6,355,540 B2 | 3/2002 | Wu |
| 6,444,569 B2 * | 9/2002 | Farkas et al. ............... 438/633 |
| 2002/0094649 A1 * | 7/2002 | Arthanari et al. ........... 438/296 |

OTHER PUBLICATIONS

"Improved Planarization for STI with Fixed Abrasive Technology", Tuyen Vo, Todd Buley, Rodel Inc., Phoenix, Arizona; John J. Gagliardi, 3M Corp., St. Paul, Minnesota—Solid State Technology, A PennNet Publication, vol. 43, Issue 6, Jun. 2000 pp. 123–128.

* cited by examiner

Primary Examiner—Kamand Cuneo
Assistant Examiner—Asok Kumar Sarkar
(74) Attorney, Agent, or Firm—Eschweiler & Associates, LLC

(57) ABSTRACT

Shallow trench isolation techniques are disclosed in which a thin nitride layer is formed on a semiconductor substrate, and a trench is formed through the nitride layer and into the semiconductor substrate, which is then filled. The wafer is then planarized using a fixed-abrasive CMP process to mitigate or avoid step height in the shallow trench isolation process. The nitride layer is then removed following planarization.

26 Claims, 12 Drawing Sheets

METHODS FOR REDUCED TRENCH ISOLATION STEP HEIGHT

FIELD OF INVENTION

The present invention relates generally to semiconductor device fabrication and more particularly to improved trench isolation techniques for reducing step heights in the manufacture of semiconductor devices.

BACKGROUND OF THE INVENTION

Integrated circuits are fabricated by forming electrical devices on or in a semiconductor substrate and interconnecting these devices to form electrical circuits. In the design and manufacture of such semiconductor devices, it is necessary to isolate the individual electrical devices from one another, for example, to avoid parasitic transistor operation in adjacent MOSFET devices. Thusfar, a variety of techniques have been developed for electrically isolating devices in integrated circuit fabrication. One such technique is known as local oxidation of silicon (LOCOS), which involves selectively growing oxide in non-active or field regions of a substrate using a nitride mask overlying active regions thereof. However, as device geometries have been reduced beyond submicron sizes, conventional LOCOS isolation technologies have become ineffective, due to bird's beak and other shortcomings. Accordingly alternate isolation processes for CMOS and bipolar technologies have been developed for semiconductor devices such as logic and/or memory. One such technique includes shallow trench isolation (STI), in which isolation trenches are provided vertically into the substrate, which are then filled with electrically isolating materials such as silicon dioxide ($SiO_2$). The resulting (e.g., filled trench) isolation structures separate and provide electrical isolation between electric devices such as transistors and/or memory cells subsequently formed on either side of the trench.

Electrical devices, such as transistors and memory cells are formed in a series of process steps, including the patterning process steps by which circuit patterns are transferred onto the surface layers of semiconductor wafers. Of particular importance is the patterning of polysilicon structures used to form gate contacts in transistor devices, where the gate dimensions are largely determinative of channel length and associated device performance characteristics. In this regard, it is known that patterning accuracy is facilitated by surface flatness. Accordingly it is desirable to provide a smooth, substantially planar surface while patterning a semiconductor wafer, particularly for small dimension patterning in high density devices. Lithographic techniques are employed in patterning semiconductor devices, which involve optically projecting patterns onto the wafer's surface. However, where the surface is not flat, the projected image will be distorted, causing undesirable effects including variance in critical device dimensions, such as transistor channel length corresponding to gate contact dimensions.

Referring to FIGS. 1A–1G, conventional STI processing of a semiconductor wafer 2 is illustrated, beginning in FIG. 1A with a thermal oxidation process to grow a barrier or pad oxide layer 4 having a thickness 4' of about 200–400 Å over a semiconductor substrate 6. A nitride layer 8 (e.g., $Si_3N_4$) is then deposited in FIG. 1B, such as by low pressure chemical vapor deposition (LPCVD). The nitride layer 8 is used to protect the active regions of the substrate 6 from adverse effects of the subsequent formation of isolation trenches between the active regions. In addition, the nitride layer thickness is set so as to allow process control margin for non-self-stopping planarization following trench fill. Thus, the conventional nitride layer 8 is deposited to a thickness 8' of about 2,000 Å. The active regions of the device 2 are then masked in FIG. 1C using a patterned etch mask 10, leaving the isolation region of the nitride layer 8 exposed.

Thereafter an etch process 12 is employed to etch through the nitride layer 8, the barrier oxide 4, and into the substrate 6 to form a trench 14 in the exposed isolation region. As illustrated in FIG. 1D, the active mask 10 is removed and a liner 16 is formed in the trench 14, such as through thermal oxidation of the exposed portions of the trench 14, in order to remove damage from the silicon etch process 12. $SiO_2$ or other fill material 18 is then deposited in FIG. 1E via a deposition process 20 to fill the trench 14 and also to cover the nitride layer 8 in the active substrate regions. A chemical mechanical polishing (CMP) process 22 is then employed in FIG. 1F, to planarize the wafer surface, which exposes the upper surface of the nitride layer 8. Following planarization, the nitride layer 8 is then removed via an etch process 24 in FIG. 1G, leaving a step between the barrier oxide 4 and the top of the remaining trench fill material 18 having a step height 26 generally equal to the post-CMP thickness 8' of the removed nitride layer 8. In FIGS. 1F and 1G, a somewhat ideal case is illustrated, wherein the conventional CMP process 22 is stopped once the nitride layer 8 is exposed. In such a situation, the pre and post-CMP nitride layer heights 8' are essentially equal (e.g., FIGS. 1B and 1F). However, referring to FIGS. 1H and 1I, conventional CMP processing, such as using polyurethane polishing pads and abrasive slurries, are not self-stopping processes, and thus the post-CMP height 8'' (FIG. 1H) is seldom equal to the pre-CMP nitride thickness 8' (FIG. 1B). In FIG. 1H, for example, the CMP process 22 removes the oxide material 18 over the nitride layer 8, and continues thereafter, removing an upper portion of the nitride layer 8 (e.g., over-polishing). Thus, the illustrated post-CMP nitride layer thickness 8'' is much different than the initial thickness 8' of FIG. 1B.

As can be seen in FIG. 1I, the over-polishing associated with the CMP process 22 results in a step height 26' much lower than the step height 26 in FIG. 1G. The existence of the step heights 26, 26' in FIGS. 1G and 1I has been found to cause inaccuracies in subsequent gate contact formation in the active regions adjacent the trench 14, resulting in variance in the critical gate dimensions. The variance in such step heights, due to the non-self-stopping nature of conventional CMP planarization techniques, further hinders efforts at controlling such critical dimensions. For instance, the step heights 26, 26' have been found to vary from about 300 to about 2000 Å. Consequently, it is difficult to control the step heights 26, 26' where conventional CMP planarization processes are employed.

The conventional CMP processing 22 typically involves rotation of the silicon wafer 2 against a polishing pad in the presence of an abrasive slurry (not shown) while applying pressure. The polishing pad, generally a polyurethane-based material, includes polymeric foam cell walls, which aid in removal of the reaction products at the wafer interface. The controlled pressure forces the abrasive particles of the slurry into intimate contact with the wafer surface, whereas the velocity of rotation controls mechanical removal rate as the abrasive slurry particles are transported to the wafer surface. However, the conventional CMP 22 is not a self-stopping process. Accordingly, the nitride layer 8 is typically made thick, for example about 2000 Å, in order to allow process margin to prevent the CMP processing 22 from damaging the underlying substrate. Thus, the initial nitride layer thickness 8' is typically tailored to accommodate over-polishing associated with the conventional CMP process 22. Following the CMP process 22, the nitride layer 8 is removed and the underlying barrier or pad oxide layer 4 may be regrown or reformed to provide a gate oxide layer of predetermined thickness in the active regions. Thereafter, the electrical devices, such as transistors and/or memory cells (not shown) are formed in or on the substrate, and dielectric and connection (metal) layers are processed to interconnect the devices.

During formation of such electrical devices, photo lithographic techniques are used to pattern various features to create structures thereof. For example, etch masks are patterned to define the length of polysilicon gate structures which are etched from a polysilicon layer deposited over the gate oxide layer. However, such photolithography processes are less accurate in the presence of non-planar surface features. One such non-planar surface characteristic is the step resulting from the removal of the nitride layer 8 following CMP planarization 22 (e.g., step heights 26 and 26' of FIGS. 1G and 11, respectively). In the conventional STI processing described above, the step heights 26, 26' of the trench fill material 18 at the edges of the isolation trench 14 are largely determined by the thickness of the nitride layer 8 after termination of the CMP polishing 22.

However, as illustrated above, the CMP process 22 is not controllable to a high degree of accuracy, and therefore, the post-CMP nitride layer thickness (e.g., 8', 8"), as well as the resulting step heights 26, 26' may vary greatly. As a result, the corresponding misalignment inaccuracies in the subsequent poly gate patterning are variable as well, leading to undesirable variances in the critical dimensions (CDs) of subsequently formed electrical devices. Thus, there remains a need for improved techniques for isolating electrical devices in semiconductor devices by which these and other critical dimensions may be better controlled by reducing STI related step heights and mitigating the variance in these step heights.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later. The present invention relates to methodologies allowing reduction of step heights associated with trench isolation generally in semiconductor devices, such as shallow trench isolation (STI) processing, by which the above mentioned and other difficulties encountered in the prior art may be mitigated.

Toward that end, the invention may be employed to improve or facilitate critical dimension (CD) control and/or repeatability in the manufacture of semiconductor devices. Fixed-abrasive CMP or other substantially self-stopping planarization techniques are employed, by which a post-planarization nitride layer thickness can be controlled to be close to or the same as the pre-planarization thickness. Consequently, the nitride layer is no longer required to function as a CMP stop layer, whereby the initial nitride layer thickness may be reduced compared with prior STI processes. This, in turn, facilitates reduction and repeatability in post-planarization step heights between trench fill material and active regions of a substrate. As a result, step height related inaccuracies and variances in patterning device features, such as gate structures, may be reduced.

According to one aspect of the invention, a method is provided for fabricating an isolation structure in a semiconductor wafer. The method comprises forming a nitride layer over a substrate, which is significantly thinner than was previously used. In one implementation, the initial nitride layer is formed to a thickness of about 100 Å or more and about 500 Å or less. One or more isolation trenches are then formed through the nitride layer and into isolation regions of the substrate. The trenches are then filled with isolating material such as oxide, which also covers the remaining nitride layer overlying the active regions of the wafer. The wafer is then planarized using a substantially self-stopping material removal process to provide a substantially planar top surface comprising the exposed portion of the nitride layer and a remaining portion of the fill material in the trenches. In one example, fixed-abrasive CMP processing can be employed, using fixed-abrasive polishing pads and slurries substantially free of abrasives. Thereafter, the remaining nitride layer is removed.

Another aspect of the invention provides for formation of a somewhat thicker initial nitride layer, with a portion thereof being removed following trench formation and prior to trench filling. In this manner, the final step height may be reduced because the remaining nitride thickness over which the fill material is deposited is reduced compared with prior techniques. In accordance with this aspect of the invention, a method is provided for fabricating an isolation structure in a semiconductor wafer, comprising forming a nitride layer to an initial thickness, for example, of about 500 Å or more over the substrate, and forming trenches through the nitride layer and into an isolation region of the substrate. A first portion of the nitride layer is then removed to leave a second portion thereof remaining over the active regions. The trenches are then filled and the wafer is planarized using a substantially self-stopping material removal process, such as fixed-abrasive CMP, after which the remaining nitride layer is removed.

To the accomplishment of the foregoing and related ends, the following description and annexed drawings set forth in detail certain illustrative aspects and implementations of the invention. These are indicative of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
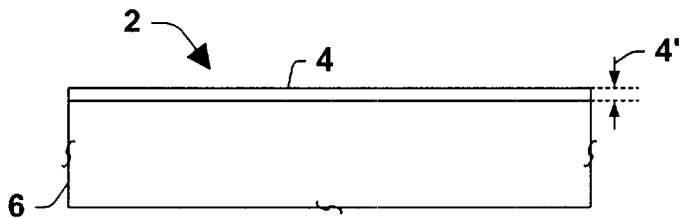
FIGS. 1A–1I are partial side elevation views in section illustrating a conventional shallow trench isolation process for providing isolation between adjacent electrical devices in an upper portion of a semiconductor wafer.
Figure 1B:
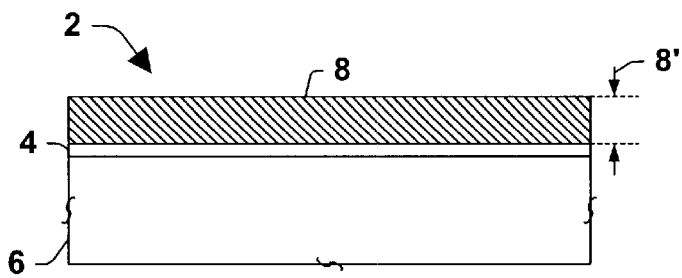
Figure 1C:
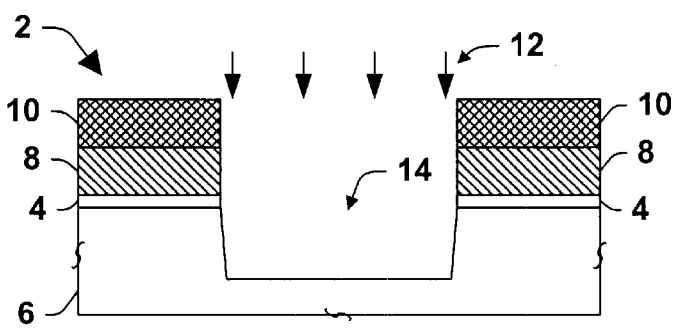
Figure 1D:
Figure 1E:
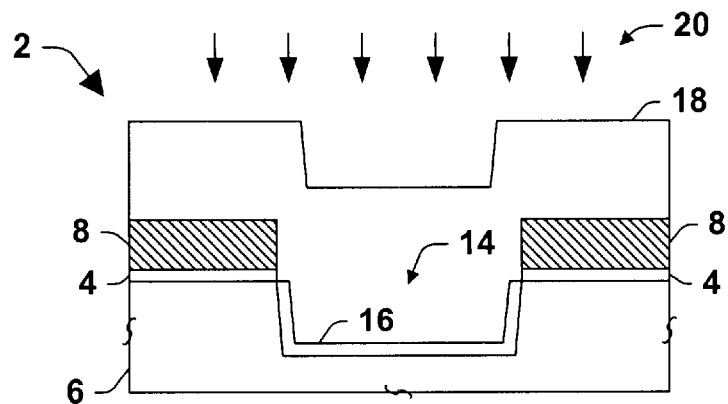
Figure 1F:
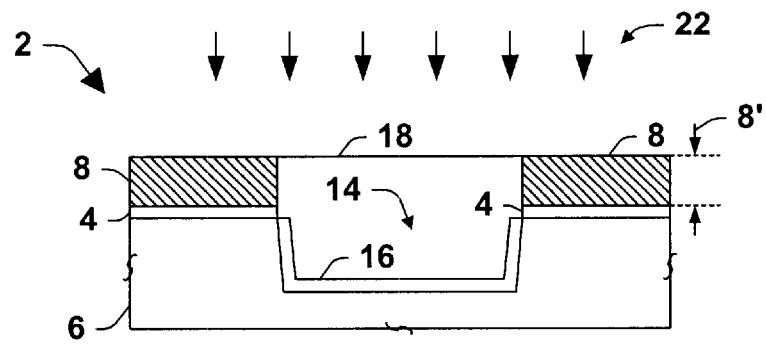
Figure 1G:
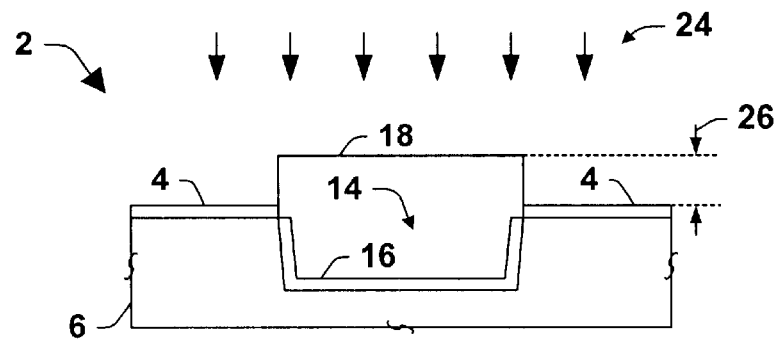
Figure 1H:
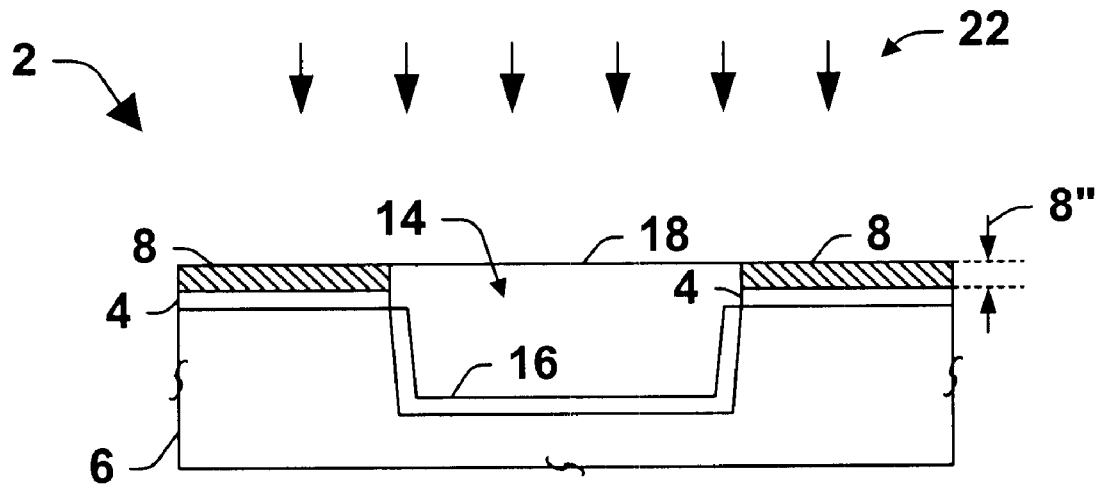
Figure 1I:
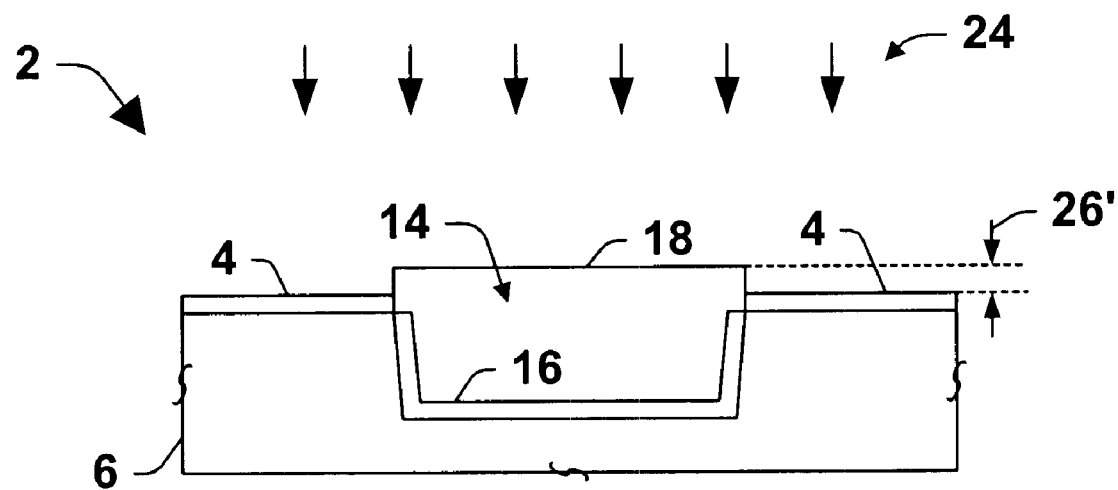

The present invention will now be described with reference to the drawings wherein like reference numerals are used to refer to like elements throughout. The invention may be employed to reduce or mitigate STI trench fill material step heights associated with previous isolation processes, and/or to reduce the variance therein. This, in turn, facilitates improved control over critical dimensions (CDs) associated with lithographically patterned features in subsequently formed electrical devices, such as transistors and/or memory cells in a semiconductor product. The invention advantageously employs substantially self-stopping planarization techniques such as fixed-abrasive CMP techniques or the like, which allow the employment of thinner nitride layers. Following planarization and removal of the thin nitride, relatively small step heights remain with little or no variance therein, compared with prior trench isolation processes. Subsequent patterning, such as polysilicon gate structures, can then be done with reduced misalignment and other inaccuracies or variances previously caused by such steps and variances therein. The processes and methodologies of the invention may be advantageously employed in order to isolate any type of electrical devices in a semiconductor wafer, including but not limited to memory cells, transistors, and/or the like.

Figure 2:
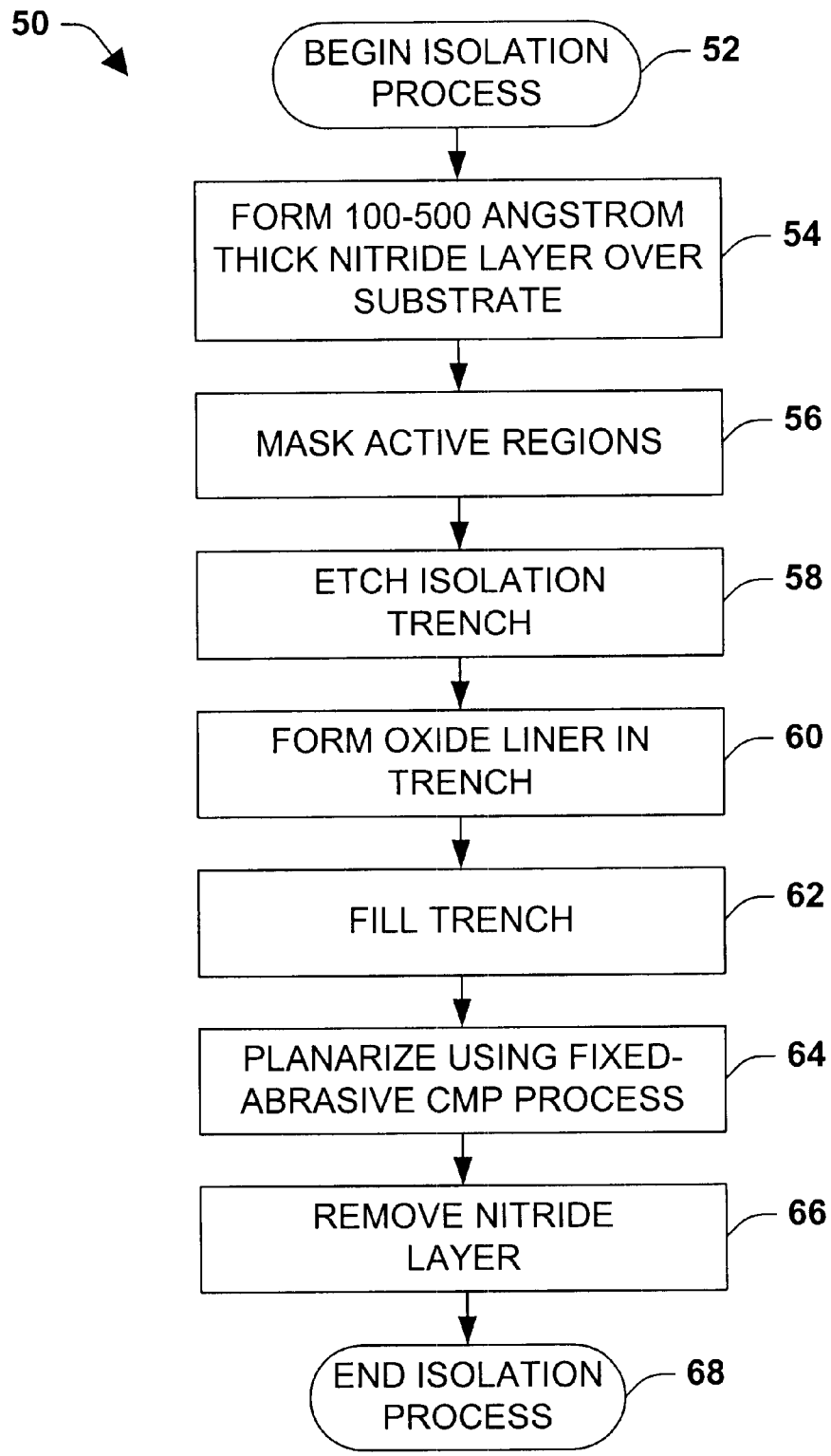
FIG. 2 is a flow diagram illustrating an exemplary method of fabricating isolation structures in a semiconductor wafer in accordance with an aspect of the present invention.

Referring initially to FIG. 2, an exemplary method 50 is illustrated for fabricating isolation structures in semiconductor wafers in accordance with one or more aspects of the present invention, in which isolation trenches may be formed between active areas or regions in a semiconductor substrate. Although the method 50 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

The isolation process or method 50 begins at 52, with a layer of nitride being formed over a substrate at 54 to a thickness of about 100 Å or more and about 500 Å or less. The nitride layer may be formed at 54 over an initial pad or barrier oxide formed over the substrate, for example, such as silicon dioxide ($SiO_2$) previously grown to a thickness of about 200–400 Å over the substrate. The nitride layer formed at 54 may comprise a single layer, for example, 100–500 Å of $Si_3N_4$, or alternatively two layers such as a back anti-reflective coating (BARC) layer of SiON over a layer of SiN, with a total thickness of about 100 Å or more and about 500 Å or less. In one implementation, a nitride thickness of about 100 Å or more and about 300 Å or less is provided, wherein it is to be appreciated that where the nitride layer is made thinner, the step height following STI isolation will be correspondingly smaller. Yet another implementation contemplates a nitride layer deposition at 54 to a thickness of about 200 Å or more and about 300 Å or less.

It is noted that nitride layer deposition at 54 to thicknesses approaching 500 Å may be useful in providing protection for the active regions during isolation trench formation. However, the invention advantageously provides for thinner nitride layers, such as 100 to 300 Å where adequate protection is provided during trench etch (e.g., at 58), while at the same time facilitating post-STI step height reduction or minimization. Thus, one particular implementation provides nitride layer deposition at 54 to a thickness of about 200 Å or more and about 300 Å or less. The nitride layer may comprise any suitable nitride material, such as SiN, $Si_3N_4$, silicon rich nitride, SiON, or others, by which protection can be afforded to the underlying substrate in active regions of the wafer during isolation trench formation. In one example, the nitride layer may be deposited at 54 using SiON in order to provide an anti-reflective coating for reliable patterning of the active regions. Formation of the nitride layer at 54 may be accomplished using any known deposition technique, such as by low pressure chemical vapor deposition (LPCVD).

Following the formation of the nitride layer at 54, isolation trenches are formed at 56–60 through the barrier oxide and nitride layers, and into the field or non-active regions of the substrate. At 56, active regions of the wafer are selectively masked, leaving the field or isolation regions exposed. The masking at 56 may be done according to known photolithography methodologies, such as depositing a resist layer over the nitride layer, exposing select portions of the resist to a radiation source through a photomask, and removing either the exposed or the unexposed portions of the resist material so as to expose a portion of the nitride layer in the field regions and to leave the active regions covered.

At 58, the isolation trench is etched using the patterned mask. The trench etch at 58 may be a multi-step etch process, by which material is removed in the exposed isolation regions so as to etch through the nitride layer, the underlying barrier oxide layer, and into the semiconductor substrate so as to form a trench. For instance, a first dry etch step may be employed at 58 to remove the nitride and oxide material in the isolation regions so as to expose the silicon wafer surface, after which a second dry etch step is performed to remove the silicon surface area through the openings in the mask, creating the desired isolation trenches. Any appropriate single or multi-step trench formation process may be employed at 58 in accordance with the present invention.

At 60, an oxide liner is formed over the exposed portions of the trench. The oxide liner can be formed in any appropriate manner, such as through thermal oxide growth at the exposed substrate surfaces of the base and sidewalls of the etched trench, wherein the remainder of the nitride layer prevents oxidation in the active regions while oxide is grown in the exposed trench of the isolation regions to form the liner. An additional isolation implant (e.g., channel stop implant) can optionally be performed at the base of trench. For example, where the bulk substrate includes p-type silicon in which where n-channel transistor devices are to be formed, a p+implant may be employed to provide further electrical isolation between electrical devices subsequently formed in active regions on either side of the resulting isolation trench, wherein such an implant would preferably be performed prior to removal of the trench etch mask.

Thereafter at 62, an electrically isolating trench fill material is formed over the wafer, covering the nitride layer in the active regions and filling the trenches in the isolation regions. The trench fill operation at 62 may be performed using any appropriate deposition process, such as depositing $SiO_2$, or other appropriate isolating material using a high density plasma (HDP) oxide deposition process, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS). However, it is to be appreciated that any deposition process may be employed at 62, and that other fill materials and deposition processes are contemplated as falling within the scope of the invention.

The method 50 continues at 64, where the wafer is planarized to expose a portion of the nitride layer in active regions, and to provide a substantially planar top surface comprising the exposed nitride and a remaining portion of the fill material in the trench. In this manner, the remaining portion of the fill material forms an electrical isolation region or structure in the trench. The remaining nitride is then removed at 66, for instance, using a wet etch process, before the isolation process 50 ends at 68. Following the isolation process 50, electrical devices such as transistors, memory cells, or others may be formed in the active regions according to known semiconductor processing methodologies.

In accordance with another aspect of the invention, substantially self-stopping material removal techniques may be advantageously employed in the method 50 at 64 so as to planarize the wafer. In one implementation, the planarization comprises removing a top portion of the fill material using a substantially self-stopping material removal process so as to expose the nitride material in the active regions and a remaining portion of the fill material in the trenches. For example, the planarization at 64 may comprise chemical mechanical polishing the fill material using a fixed-abrasive polishing pad and a slurry substantially free of abrasives, such as using processes and equipment supplied or developed by the 3M company and Rodel of Newark, Del. and/or equivalents thereof.

Such techniques have been found to provide useful material removal (e.g., polishing) rates for topography, which drops off significantly as the wafer surface becomes planar. Consequently, the high selectivity of such fixed-abrasive CMP processes to topography provides a forgiving overpolish process window, whereby the nitride layer does not need to be thickened to act as a stop layer. Rather, the planarization at 64 facilitates reduction in the nitride layer thickness at 54, which in turn reduces the post-STI step height and variance therein experienced in the prior art. As a result, improvements in critical dimensions of subsequently patterned electrical device features (e.g., poly gate structures, etc.) may be realized through employment of the present invention.

Figure 3:
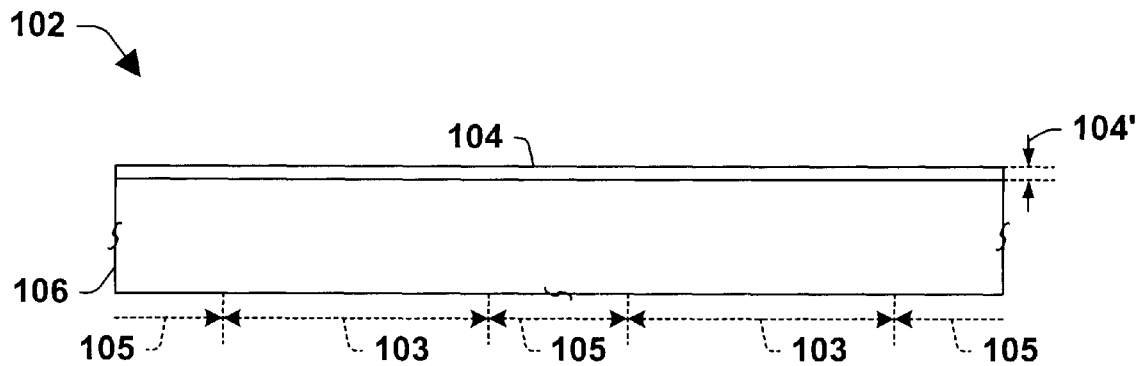
FIG. 3 is a partial side elevation view in section illustrating a barrier oxide layer being formed over an exemplary semiconductor wafer processed according to the invention.

FIGS. 3–10 further illustrate one implementation of the techniques provided by the method 50, wherein a semiconductor wafer 102 is processed to fabricate isolation structures therein. It is noted at this point that the illustrations provided in FIGS. 3–10 are not necessarily drawn to scale. In addition, it is to be appreciated that the exemplary method 50 may be employed in processing structures other than those illustrated in the following FIGS. 3–10, and further that the structures of FIGS. 3–10 may be fabricated by other techniques. Referring initially to FIG. 3, the wafer 102 comprises a semiconductor substrate 106, such as silicon partitioned into active regions 103 in which electrical devices (e.g., transistors, memory cells, or the like) are to be fabricated, and field or isolation regions 105 in which STI isolation structures are to be formed to isolate the electrical devices from one another. In FIG. 3, a thermal oxidation process (not shown) is initially employed to grow a barrier or pad oxide layer 104 to a thickness 104' of about 200–400 Å over the top surface of the substrate 106.

Figure 4:
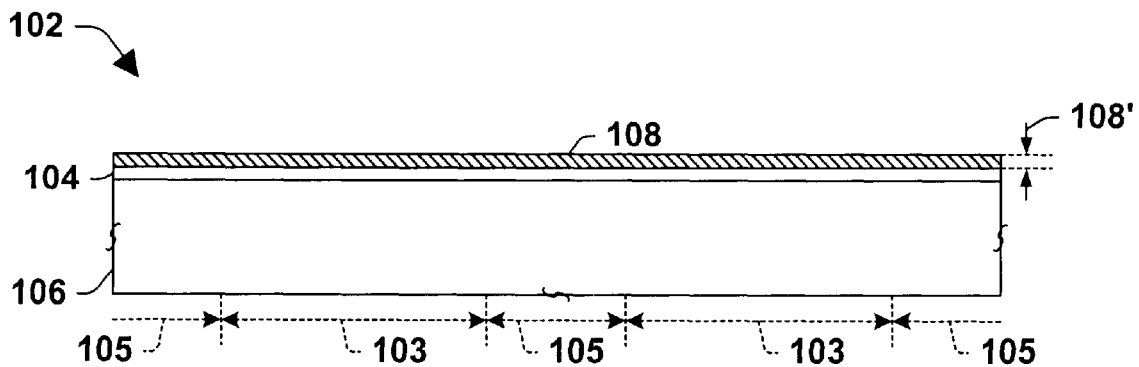
FIG. 4 is a partial side elevation view in section illustrating formation of a thin nitride layer over the semiconductor wafer of FIG. 3 in accordance with one aspect of the invention.

A thin nitride layer 108 is then is then deposited in FIG. 4, such as by low pressure chemical vapor deposition (LPCVD) or other appropriate deposition process to form the layer 108 of SiN, $Si_3N_4$, silicon rich nitride, SiON, or others having a thickness 108' of about 200 Å or more and about 300 Å or less, so as to protect the underlying substrate 106 in the active regions 103 during trench formation, while at the same time minimizing post-STI step height and the problems associated therewith. The nitride layer 108 may also provide anti-reflective coating so as to facilitate patterned masking of the active regions 103 for trench etching steps. Other implementations may alternatively provide any nitride thickness 108' in the range of about 100 Å or more and about 500 Å or less, for example, wherein thicknesses 108' approaching 500 Å may be useful in providing more protection for the active regions, including improved anti-reflective characteristics, as well as other protection during isolation trench formation in certain implementations.

In other situations, thinner nitride layer thicknesses 108' may be employed in accordance with the invention, for example, in a range of about 100 Å or more and about 300 Å or less, so as to both provide active region protection during trench formation, as well as to reduce post-STI step height. The exemplary nitride layer 108 comprises a single layer structure, although multi-layer structures may alternatively be employed. It is noted that whereas prior STI techniques employing conventional CMP planarization processes resulted in post-STI step heights ranging to as high as 1000–2000 Å or more with potentially large variances therein, the implementation of FIGS. 3–10 advantageously reduces the step height to about 500 Å or less, generally depending upon the initial nitride layer deposition thickness 108'. Further, the invention reduces the variance in the post-STI step height, and accordingly facilitates reduced variance in critical dimensions of later formed electrical device structures.

Figure 5:
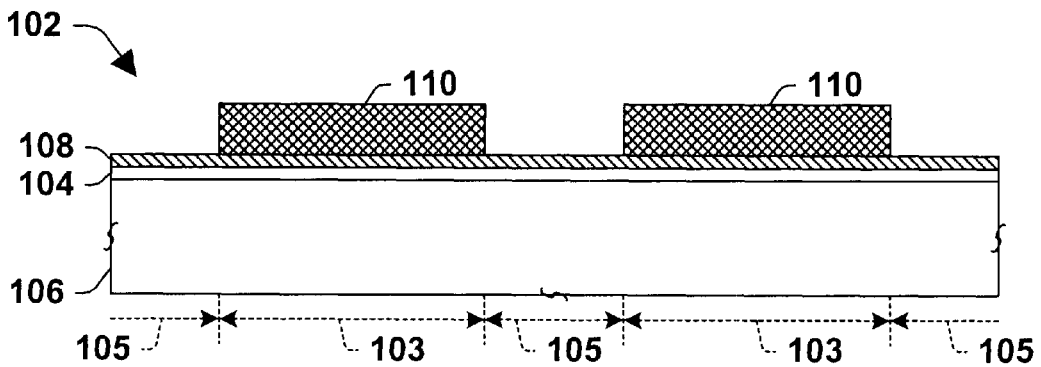
FIG. 5 is a partial side elevation view in section illustrating an active mask used to define active and isolation regions in the wafer of FIGS. 3 and 4.
Figure 6:
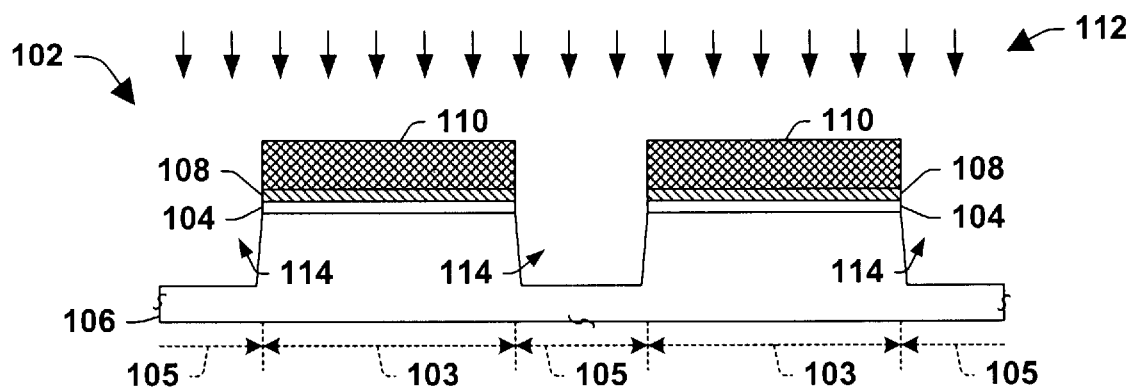
FIG. 6 is a partial side elevation view in section illustrating formation of isolation trenches in the wafer of FIGS. 3–5.

In FIG. 5, the active regions 103 of the device 102 are masked using a patterned etch mask 110 such as an exposed and developed photoresist, leaving the nitride layer 108 exposed in the isolation regions 105. Thereafter in FIG. 6, a dry etch process 112 is employed to etch through the nitride layer 108, the pad oxide 104, and into the substrate 106 to form trenches 114 in the exposed isolation regions 105. As discussed above with respect to step 58 of the method 50 in FIG. 2, the etch process 112 may comprise a multi-step etch process, by which material is removed in the exposed isolation regions 105 so as to etch through layers 108 and 104, and into the semiconductor substrate 106 to form the trenches 114. In one example, a first etch may be employed in process 112 to remove portions of the nitride and oxide layers 108 and 104, respectively, in the isolation regions 105. The process 112 may further comprise a second etch to remove the silicon from the substrate 106 so as to create the isolation trenches 114 in the regions 105.

Figure 7:
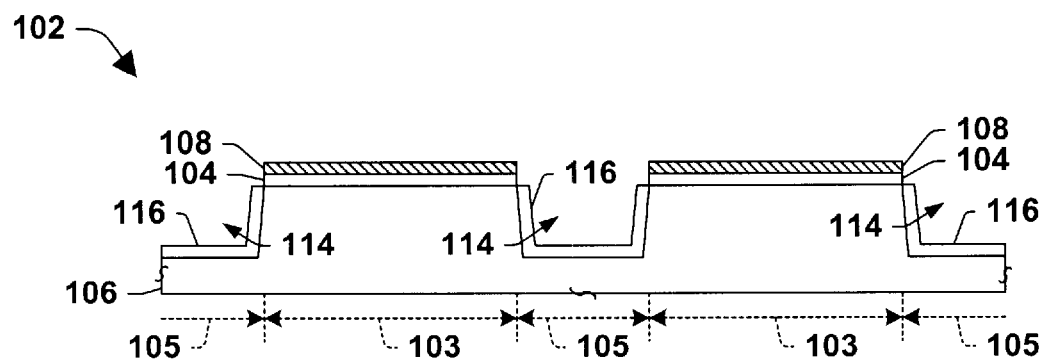
FIG. 7 is a partial side elevation view in section illustrating formation of a trench liner in the wafer of FIGS. 3–6.
Figure 8:
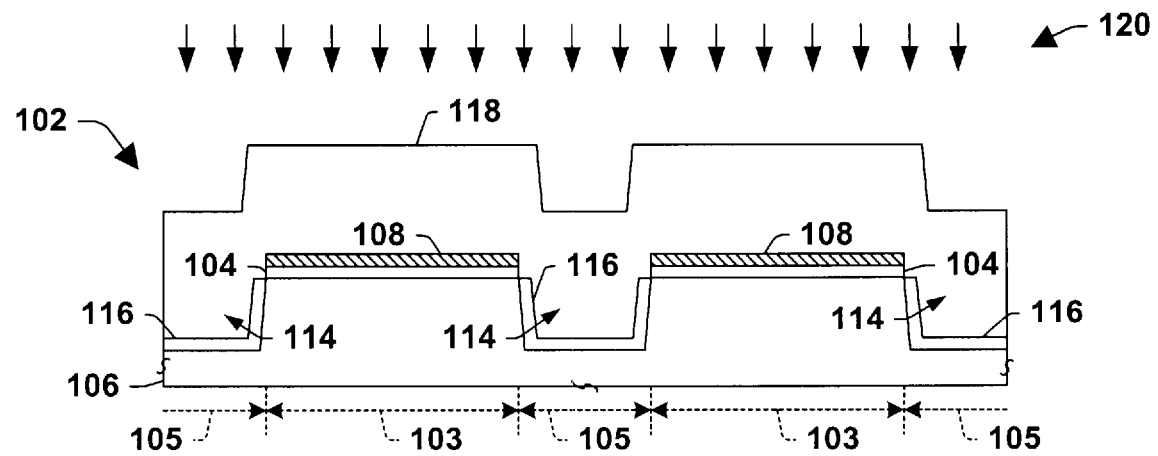
FIG. 8 is a partial side elevation view in section illustrating deposition of trench fill material over the wafer of FIGS. 3–7.

In FIG. 7, the active mask 110 is removed and a liner 116 is formed in the trenches 114, such as through thermal oxidation of the exposed portions of the trenches 114. The trenches 114 are then filled in FIG. 8 with electrically isolating material 118 such as via a deposition process 120. The process 120 may involve any appropriate deposition methodologies as are known, such as depositing $SiO_2$ or other isolating material 118 using a high density plasma (HDP) oxide deposition process, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS), although other fill materials 118 and deposition processes 120 are contemplated as falling within the scope of the appended claims.

Figure 9:
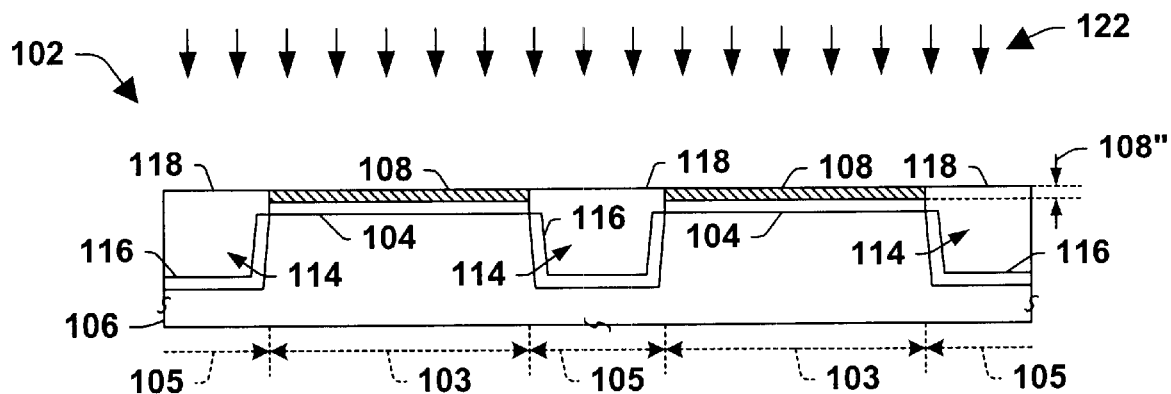
FIG. 9 is a partial side elevation view in section illustrating a fixed-abrasive chemical mechanical polishing process for planarizing the wafer of FIGS. 3–8.

In FIG. 9, a substantially self-stopping material removal process 122 is performed, such as fixed-abrasive CMP polishing using a substantially abrasive-free slurry to remove at least a top portion of the fill material 118. The inventors have appreciated that fixed-abrasive CMP processing as developed by the 3M company and Rodel of Newark, Del. or the like provides substantially self-stopping planarization compared with conventional CMP techniques using slurries with abrasive particles therein. In conventional CMP using slurries having abrasive particles, the relatively thick nitride layers on the order of 2000 Å were maintained throughout planarization to act as a CMP stop layer. As illustrated above in FIGS. 1F–1I, the non-self-stopping nature of abrasive-slurry CMP processes leads to potentially large variance in the post-STI step heights, because movement of the abrasive particles continues to polish even where the polishing pad is no longer forced toward the wafer, because the abrasive particles keep moving around in the slurry.

However, the employment of fixed-abrasive CMP polishing with abrasive-free slurries in the process 122 allows planarization with a much thinner nitride layer 108. The exemplary process 122 advantageously employs fixed-abrasive polishing pads, wherein abrasive particles are fixed in the pad, rather than dispensed within a slurry, as illustrated and described further below with respect to FIGS. 21A and 21B. In particular, it is believed that in fixed-abrasive CMP processing, the chemical contribution to material removal is much less than was the case in abrasive-slurry CMP. As a result, it is believed that the amount of polishing can be controlled to a degree not previously achievable, by which a thick nitride stop layer is no longer needed during planarization. Consequently, the nitride layer thickness 108' is significantly less in the present invention (e.g., about 100 Å or more and about 500 Å or less) than was previously feasible with conventional CMP planarization. It is noted that although the implementations illustrated and described herein take advantage of the self-stopping nature of fixed-abrasive type CMP processes, other substantially self-stopping material removal processes can be employed for planarization in accordance with the present invention and that all such processes and equivalents thereof are contemplated as falling within the scope of the appended claims.

Figure 10:
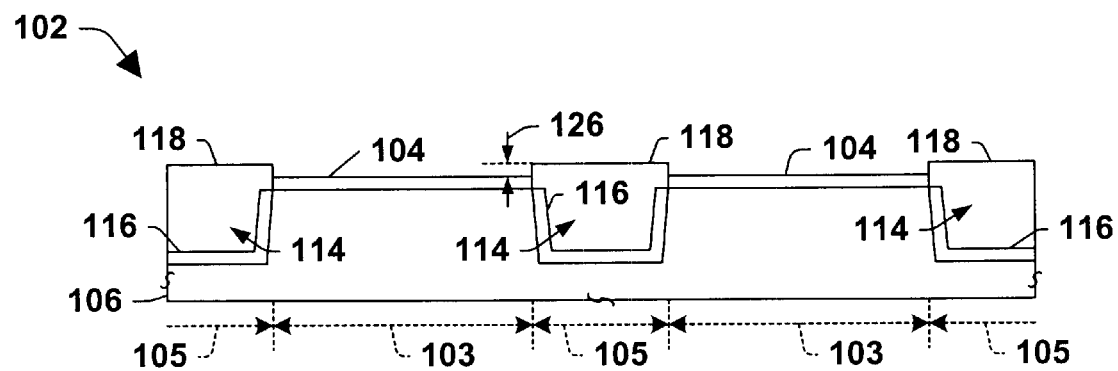
FIG. 10 is a partial side elevation view in section illustrating the wafer of FIGS. 3–9 following removal of the nitride layer.

The process 122 may be used to complete the planarization, or alternatively may be employed to remove the top portion of the fill material 118, with a second portion of the fill material 118 being removed in a subsequent wet etch step (not shown) so as to expose the nitride layer 108. Thus, once the nitride layer 108 is exposed via the process 122, the resulting, generally planar structure 102 is illustrated in FIG. 9, wherein the thickness 108" of the remaining nitride layer 108 is substantially commensurate of the pre-CMP thickness 108' (e.g., about 200 Å or more and about 300 Å or less as in FIG. 4). Referring also to FIG. 10, once the planarization process 122 is completed, the nitride layer 108 is removed, such as via a wet etch process, leaving a post-STI step height 126 substantially the same as the final nitride layer thickness 108". Thus, the step height 126 is fairly small and more controllable than was the case in the prior art, not being subject to the fairly large variance previously experienced. This, in turn, allows for improved control over patterned feature dimensions in subsequently formed electrical devices (e.g., memory devices, transistors, or the like) in the active regions 103.

Another aspect of the invention provides for formation of a somewhat thicker initial nitride layer, for example, where more protection is initially desired for the active regions of the substrate during isolation trench formation. The invention provides for forming such a nitride layer, such as having a thickness of about 500 Å or more, performing trench formation, and then removing a portion of the nitride prior to trench filling. In this way, the post-planarization nitride thickness, and hence the post-STI step height, can be controlled in a repeatable manner so as to mitigate critical dimension inaccuracies and/or variances in subsequently fabricated electrical devices. For instance, as with the above implementations of FIGS. 2–10, the following exemplary implementations of FIGS. 11–20 facilitate reduction in the final (e.g., post-STI) step height compared with prior techniques, because the remaining nitride thickness over which the fill material is deposited is reduced. Thus, initial nitride thicknesses of about 500 Å or more can be maintained during trench formation, which are then reduced, for example, to about 100 Å or more and about 300 Å or less prior to trench filling.

Figure 11:
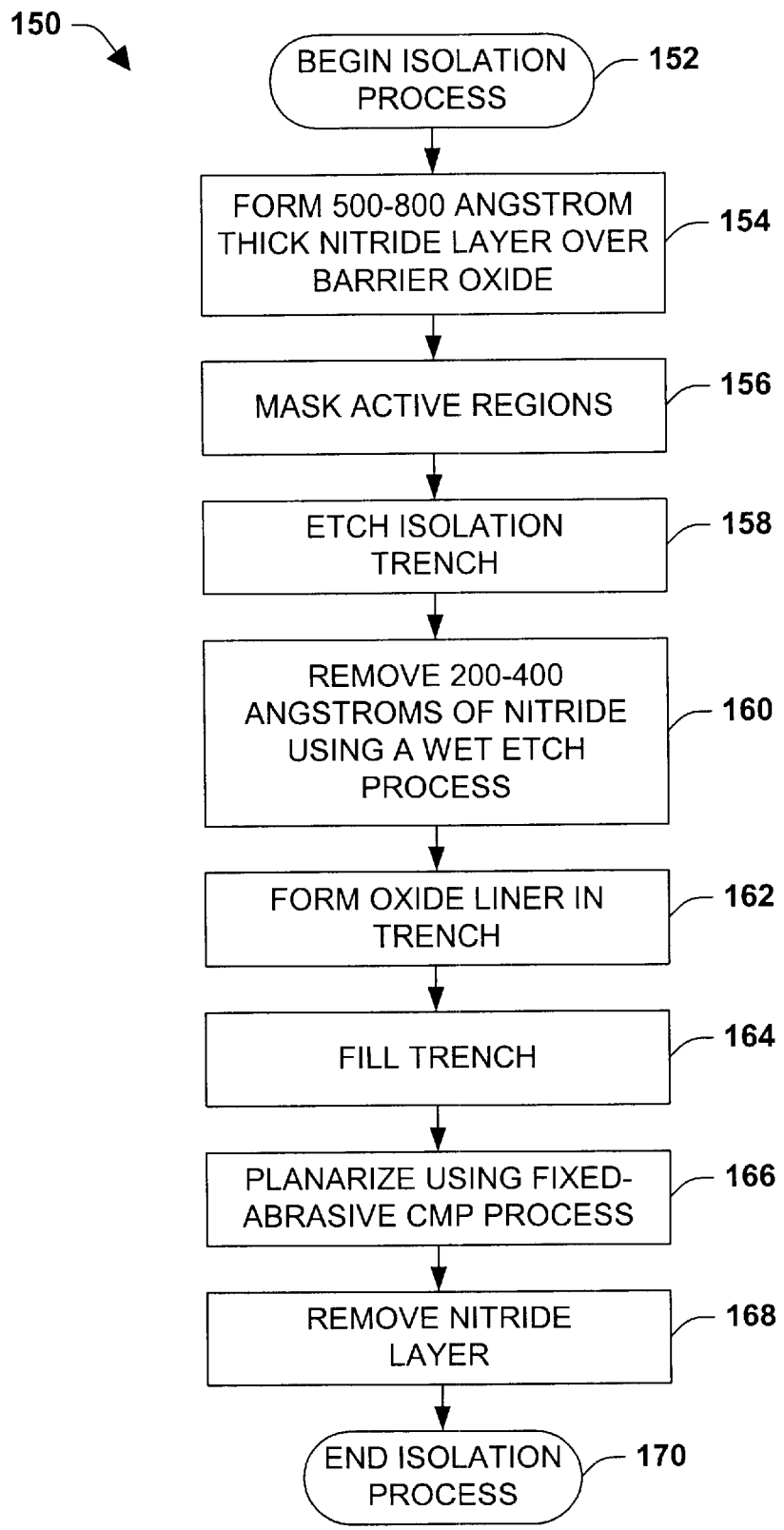
FIG. 11 is a flow diagram illustrating another exemplary method of fabricating isolation structures in a semiconductor wafer in accordance with another aspect of the present invention.

FIG. 11 illustrates one exemplary method 150 for implementing this and other aspects of the invention, wherein some of the processing steps are similar to those previously illustrated and described with respect to the above implementations. Although the method 150 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

The isolation method 150 begins at 152, with a layer of nitride being formed over a substrate at 154 having a thickness of about 500 Å or more. The nitride layer may be formed at 154 over an initial pad or barrier oxide formed over the substrate, and may comprise a single layer, for example, 500–800 Å of $Si_3N_4$, or alternatively two layers such as a back anti-reflective coating (BARC) layer of SiON over a layer of SiN, with a total thickness of about 500 Å or more and about 800 Å or less in one implementation. The nitride layer deposition at 154 to thicknesses above 500 Å may be useful in providing added protection for the active regions during isolation trench formation. However, the invention advantageously provides substantially self-stopping planarization techniques as illustrated and described hereinafter, whereby the nitride layer formed at 154 need not be as thick as those of the prior art (e.g., 2000 Å). The nitride layer, moreover, may comprise any suitable nitride material, such as SiN, $Si_3N_4$, silicon rich nitride, or others, by which protection can be afforded to the underlying substrate in active regions of the wafer during isolation trench formation. Formation of the nitride layer at 154 may be accomplished using any known deposition technique, such as by low pressure chemical vapor deposition (LPCVD).

Thereafter, isolation trenches are formed at 156–162 through the barrier oxide and nitride layers, and into the isolation regions of the substrate. At 156, active regions of the wafer are selectively masked, leaving the field or isolation regions exposed, such as using known photolithography techniques. At 158, the isolation trench is etched using the patterned mask, for example, using a single or a multi-step etching process by which material is removed in the exposed isolation regions so as to etch through the nitride layer, the underlying barrier oxide layer and into the semiconductor substrate, thereby forming a trench.

At 160, a first portion of the nitride layer material is removed, such as about 200 Å or more and about 400 Å or less. This nitride removal at 160 is accomplished using a wet etch process, but other material removal methodologies can be employed. In order to reduce the final post-isolation step height (e.g., which is related to the nitride layer thickness), the removal of a first portion of nitride at 160 advantageously leaves a second, relatively thin portion of the nitride layer remaining over the active regions of the semiconductor substrate. As described above, the nitride layer thickness which is covered with oxide during subsequent trench filling is largely determinative of the post-STI step height of interest. Thus, the removal of a portion of the nitride at 160 can leave the remaining second portion having a thickness which provides enough protection against overpolish in the subsequent planarization, while being thin enough to mitigate the step height related critical dimension problems associated with the prior art. Thus in one example, the removal of the first portion of nitride at 160 may be done so as to leave the remaining second portion of the nitride layer having a thickness of about 100 Å or more and about 300 Å or less. In another example, the remaining second portion may have a thickness of about 200 Å or more and about 300 Å or less.

Thereafter, at 162, an oxide liner is formed over the exposed portions of the trench in similar fashion to those trench liners illustrated and described above, and channel-stop implantations can optionally be performed at 162. At 164, the trenches are filled with an electrically isolating trench fill material, covering the remaining second portion of the nitride layer in the active regions and filling the trenches in the isolation regions. The trench fill operation at 164 may be done using any appropriate materials and processes such as those described above. The wafer is then planarized at 166 to expose the second portion of the nitride layer in active regions, and to provide a substantially planar top surface comprising the exposed nitride and a remaining portion of the fill material in the trench. The remaining nitride is then removed at 168 before the method 150 ends at 170. Electrical devices may thereafter be formed in the active regions according to known semiconductor processing methodologies.

As with the above implementations of FIGS. 3–10, substantially self-stopping material removal techniques may be employed in the planarization of 166, for example, including chemical mechanical polishing the fill material using a fixed-abrasive polishing pad and a slurry substantially free of abrasives, such as using processes and equipment supplied or developed by the 3M company and Rodel of Newark, Del. and/or equivalents thereof. The self-stopping nature of such processes allows the thinning of the nitride layer at 160, by which the advantages of reduced post-STI step heights can be realized (e.g., improved CD accuracy and repeatability for subsequently formed electrical device features). FIGS. 12–20 illustrate one implementation of this aspect of the invention, generally in accordance with the exemplary method 150. It will be appreciated that variants of the illustrated structures and isolation methodologies are contemplated as falling within the scope of the invention, and it is also noted at this point that the structures illustrated in FIGS. 12–20 are not necessarily drawn to scale.

Figure 12:
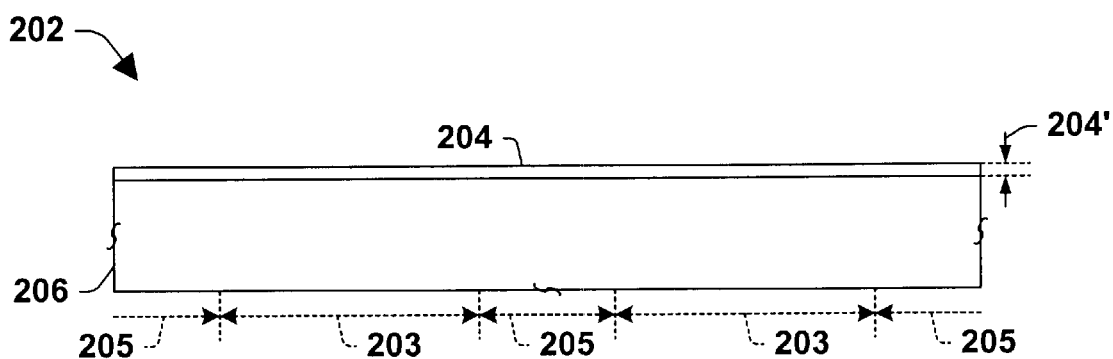
FIG. 12 is a partial side elevation view in section illustrating a barrier oxide layer being formed over another exemplary semiconductor wafer processed according to the invention.
Figure 13:
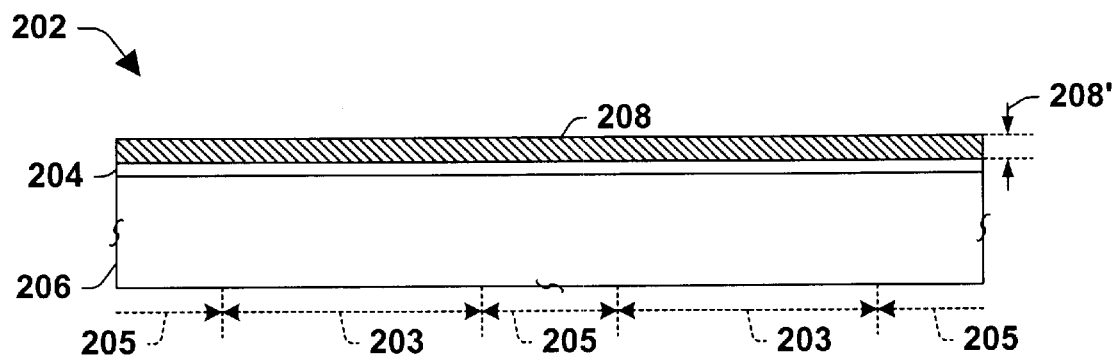
FIG. 13 is a partial side elevation view in section illustrating formation of a nitride layer over the semiconductor wafer of FIG. 12.

In FIG. 12, a wafer 202 is illustrated comprising a substrate 206, such as silicon partitioned into active regions 203 in which electrical devices are to be fabricated, as well as isolation regions 205 in which STI isolation structures are to be formed. In FIG. 12, a barrier or pad oxide layer 204 is formed to a thickness 204' of about 200–400 Å over the top surface of the substrate 206. A nitride layer 208 is then is then deposited in FIG. 13 to a thickness of about 500 Å or more, via the techniques and materials described above or equivalents thereof. The initial nitride thickness 208' may be, for example, 500–800 Å where it is desired to provide greater protection to the underlying active regions of the substrate 206 during subsequent trench formation. However, once the trench formation is completed, the thickness of the layer 208 is advantageously reduced, as described below with respect to FIG. 16. The nitride layer 208, moreover, may comprise a single or a multi-layer structure, for example, where the total thickness 208' is about 500 Å or more.

Figure 14:
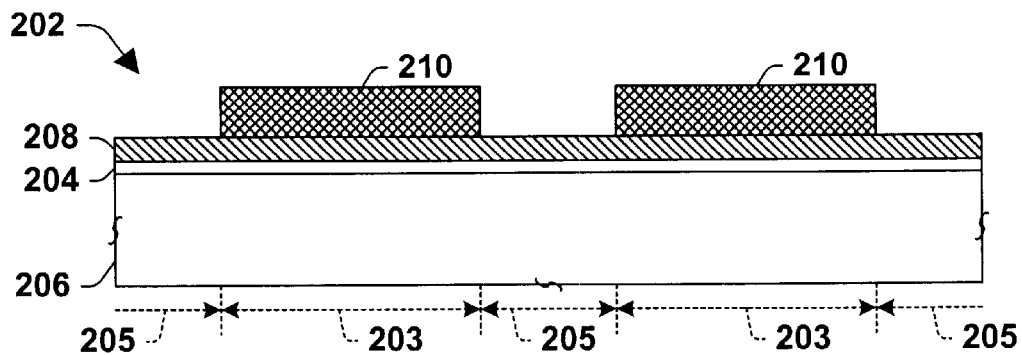
FIG. 14 is a partial side elevation view in section illustrating an active mask used to define active and isolation regions in the wafer of FIGS. 12 and 13.
Figure 15:
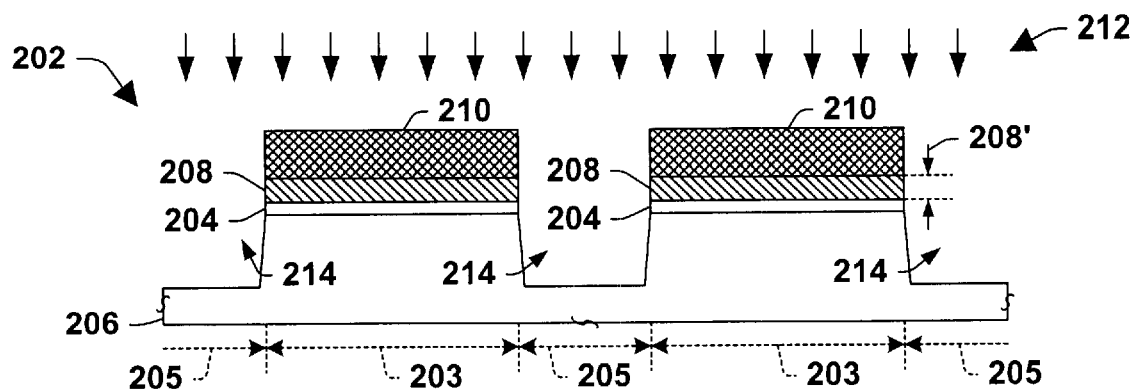
FIG. 15 is a partial side elevation view in section illustrating formation of isolation trenches in the wafer of FIGS. 12–14.

In FIG. 14, the active regions 203 of the device 202 are masked using a patterned etch mask 210, leaving the nitride layer 208 exposed in the isolation regions 205. In FIG. 15, an etch process 212 is employed to etch through the nitride layer 208, the pad oxide 204, and into the substrate 206 to form trenches 214 in the exposed isolation regions 205. As discussed above, the process 212 may comprise a multi-step etch process, for example, a first etch to remove portions of the nitride and oxide layers 208 and 204, respectively, and a second etch to remove the silicon from the substrate 206 so as to create the isolation trenches 214. Following trench formation in FIG. 15, the active mask 210 is removed.

Figure 16:
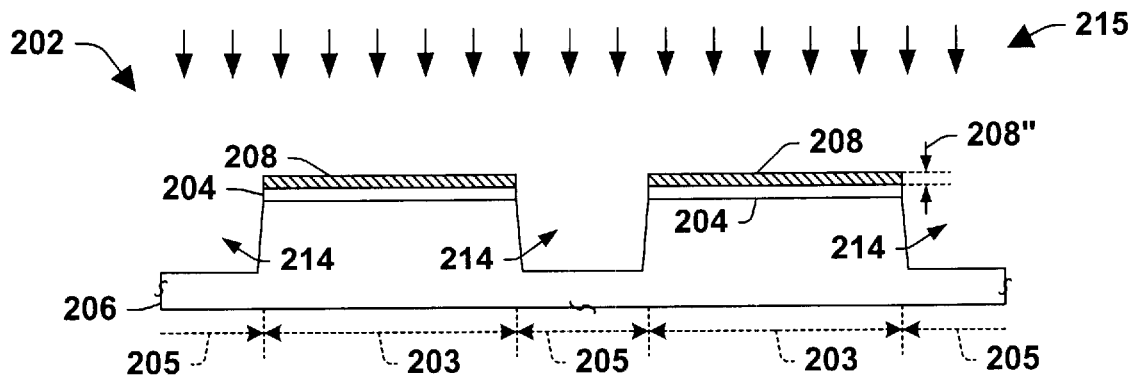
FIG. 16 is a partial side elevation view in section illustrating the wafer of FIGS. 12–15 following removal of a portion of the nitride layer prior to trench filling in accordance with an aspect of the invention.

In accordance with this aspect of the invention, a first portion of the nitride layer 208 is removed via a wet etch process 215, as illustrated in FIG. 16, following formation of the trenches 214, and prior to trench filling. Thus, as illustrated in FIG. 16, about 200 Å or more and about 400 Å or less nitride may be removed via the process 215, leaving a second remaining portion having a thickness 208". The nitride removal by the process 215 may be accomplished using wet etching or any other appropriate techniques as are known. Thus, in order to reduce the final post-isolation step height (e.g., which is related to the nitride layer thickness after planarization), the thickness 208" of the remaining nitride in the illustrated implementation is about 100 Å or more and about 300 Å or less. In another example, the remaining second portion may have a thickness 208" of about 200 Å or more and about 300 Å or less.

Figure 17:
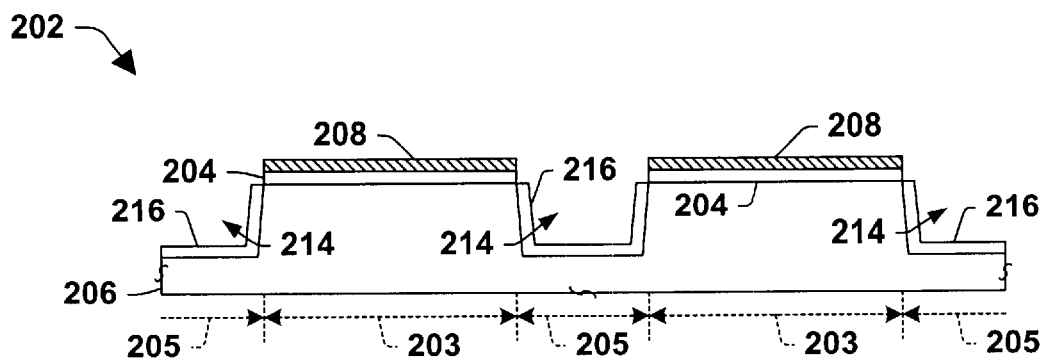
FIG. 17 is a partial side elevation view in section illustrating formation of a trench liner in the wafer of FIGS. 12–16.
Figure 18:
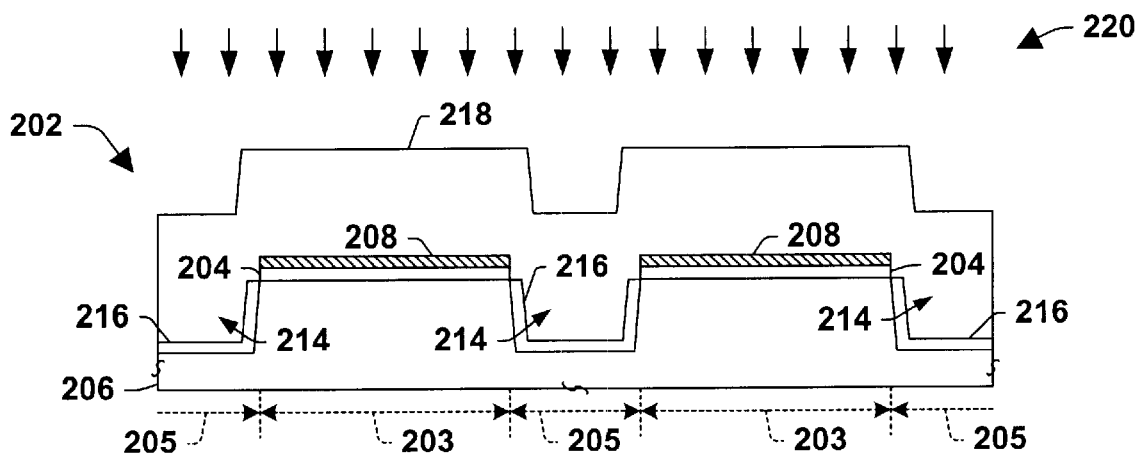
FIG. 18 is a partial side elevation view in section illustrating deposition of trench fill material over the wafer of FIGS. 12–17.

In FIG. 17, a liner 216 is formed in the trench 214, such as through thermal oxidation of the exposed portions of the trench 214. The trenches 214 are then filled in FIG. 18 with electrically isolating material 218 such as via a deposition process 220. The process 220 may involve any appropriate deposition methodologies as are known, such as those illustrated and described above and equivalents thereof In FIG. 19, a substantially self-stopping material removal or planarization process 222 is performed, such as the fixed-abrasive CMP polishing techniques set forth above and/or equivalents thereof, for example, employing a substantially abrasive-free slurry to remove at least a top portion of the fill material 218. The process 222 may be used to complete the planarization, or alternatively may be employed to remove the top portion of the fill material 218, with a second portion of the fill material 218 being removed in a subsequent wet etch step (not shown) so as to expose the nitride layer 208.

Figure 19:
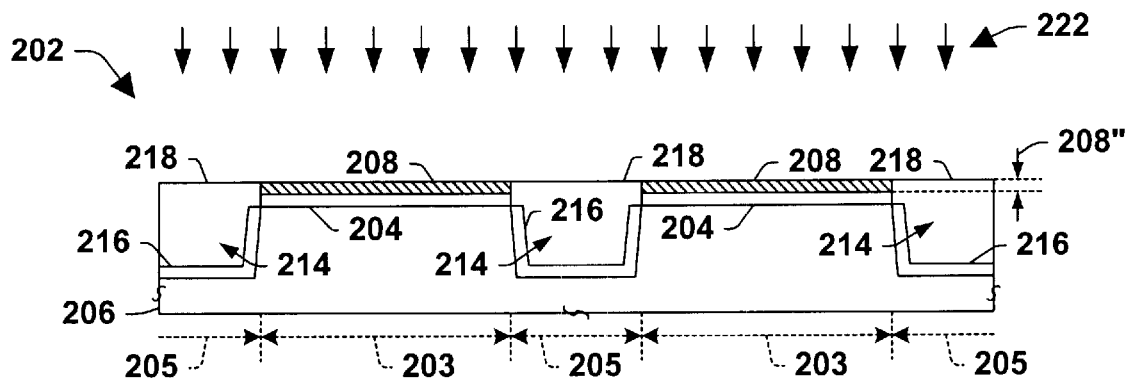
FIG. 19 is a partial side elevation view in section illustrating a fixed-abrasive chemical mechanical polishing process for planarizing the wafer of FIGS. 12–18.
Figure 20:
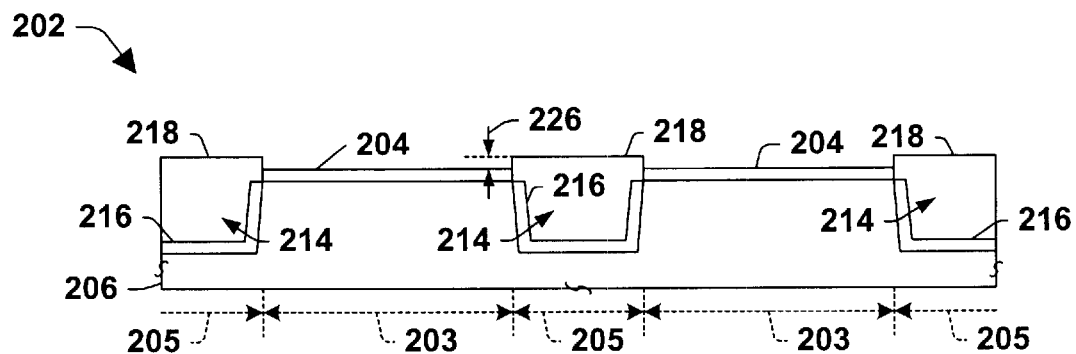
FIG. 20 is a partial side elevation view in section illustrating the wafer of FIGS. 12–19 following removal of the remaining portion of the nitride layer.

Once the remaining portion of the nitride layer 208 is exposed via the process 222, the resulting, generally planar structure 202 is illustrated in FIG. 19, wherein the thickness 208" of the remaining nitride layer 208 is substantially commensurate of the pre-CMP thickness of FIG. 16 (e.g., about 200 Å or more and about 300 Å or less in this implementation). Referring also to FIG. 20, once the planarization process 222 is completed, the remaining nitride 208 is removed, such as via a wet etch process, leaving a post-STI step height 226 substantially the same as the final nitride layer thickness 208". Thus, the step height 226 is fairly small and more controllable than was the case in the prior art, which in turn, allows for improved control over patterned feature dimensions in subsequently formed electrical devices (e.g., memory devices, transistors, or the like) in the active regions 203.

Figure 21A:
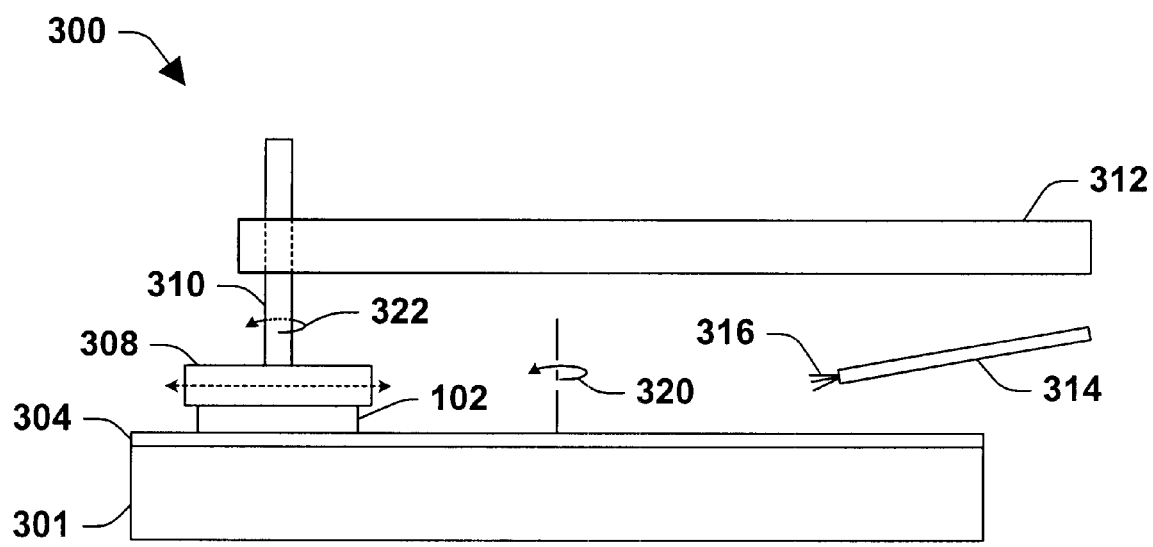
FIG. 21A is a partial side elevation view illustrating a fixed-abrasive CMP processing system according to an aspect of the present invention.
Figure 21B:
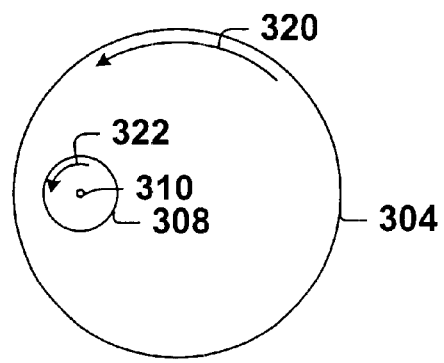
FIG. 21B is a partial top plan view further illustrating the CMP system of FIG. 21A.

Referring now to FIGS. 21A and 21B, a typical CMP apparatus or system 300 is illustrated in which the self-stopping fixed-abrasive CMP processing described above may be carried out for STI processing of wafers, such as the exemplary wafers 102 and 202 illustrated and described above. The system 300 comprises a rotatable platen 301 and a polishing pad 304 mounted on the platen 301, which may be rotatably driven by a control motor (not shown) to rotate at a controlled speed, for example, about 10 to about 100 RPM. The pad 304 advantageously comprises abrasive particles fixed therein for polishing in association with essentially abrasive-free slurries. The wafer 102 is mounted on the bottom of a rotatable carrier assembly 308 so that a major surface of the wafer 102 to be polished is positionable to contact the underlying polishing pad 304. The wafer 102 and the carrier assembly 308 are attached to a vertical spindle 310 which is rotatably mounted in a lateral arm 312.

The spindle 310 operates to rotate the carrier assembly 308 at a controlled speed, such as about 10 to about 75 RPM, in the same direction as that of the platen 301, and further radially positions the carrier assembly 308 on the platen 301. The arm 312 also vertically positions carrier assembly 308 so as to position the wafer 102 in contact with the polishing pad 304, and maintains an appropriate polishing contact pressure. Once the pressure subsides, the process essentially stops removing material from the wafer 102, as the slurry contains no abrasive particles. Thus, the primary material removal is due to contact between the pad 304 and the wafer 102. A tube 314 is located opposite the carrier assembly 308 and above the polishing pad 304 to dispense and evenly saturate the pad 304 with an appropriate cleaning agent 316, such as an abrasive-free slurry. As further illustrated in FIG. 21B, the polishing pad 304 rotates in the direction of arrow 320, while the carrier assembly 308 rotates in the direction of arrow 322, similar to the direction of arrow 320, but at a different speed than the polishing pad 304, while a downward force is applied to the carrier assembly 308 via the spindle 310 in a direction perpendicular to carrier assembly 308.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A method for fabricating an isolation structure in a semiconductor wafer, comprising:

forming a nitride layer to a thickness of about 100 Å or more and about 500 Å or less over a semiconductor substrate;

forming at least one trench through the nitride layer and into an isolation region in the semiconductor substrate;

forming an electrically isolating material over the semiconductor substrate, the electrically isolating material covering the nitride layer in at least one active region in the semiconductor substrate and filling the at least one trench;

planarizing the electrically isolating material using a substantially self-stopping material removal process to expose a portion of the nitride layer in the at least one active region, and to provide a substantially planar top surface comprising the exposed portion of the nitride layer and a remaining portion of the electrically isolating material in the at least one trench, the remaining portion of the electrically isolating material forming an isolation structure in the at least one trench;

removing the remaining nitride layer; and removing a portion of the nitride layer after the step of forming the at least one trench and before the step of forming the electrically isolating material.

2. The method of claim 1, wherein planarizing the electrically isolating material comprises removing a portion of the electrically isolating material using a fixed-abrasive chemical mechanical polishing process.

3. The method of claim 2, wherein the fixed-abrasive chemical mechanical polishing process comprises chemical mechanical polishing the electrically isolating material using a fixed-abrasive polishing pad and a slurry substantially free of abrasives.

4. The method of claim 2, wherein forming the nitride layer comprises forming the nitride layer to a thickness of about 300 Å or less over the semiconductor substrate.

5. The method of claim 4, wherein forming the nitride layer comprises forming the nitride layer to a thickness of about 200 Å or more over the semiconductor substrate.

6. The method of claim 1, wherein forming the nitride layer comprises forming the nitride layer to a thickness of about 200 Å or more and about 300 Å or less over the semiconductor substrate.

7. The method of claim 1, wherein planarizing the electrically isolating material comprises:

removing at least a top portion of the electrically isolating material using a substantially self-stopping fixed-abrasive chemical mechanical polishing process; and removing a second portion of the electrically isolating material so as to expose the portion of the nitride layer in the at least one active region and the remaining portion of the electrically isolating material in the at least one trench.

8. The method of claim 7, wherein removing at least a top portion of the electrically isolating material comprises chemical mechanical polishing the electrically isolating material using a fixed-abrasive polishing pad and a slurry substantially free of abrasives.

9. The method of claim 8, wherein removing the second portion of the electrically isolating material comprises etching the second portion of the electrically isolating material using a wet etch process to expose the portion of the nitride layer in the at least one active region.

10. A method for fabricating an isolation structure in a semiconductor wafer, comprising:

forming a nitride layer to a thickness of about 500 Å or more over a semiconductor substrate;

forming at least one trench through the nitride layer and into an isolation region in the semiconductor substrate;

removing a first portion of the nitride layer after forming the at least one trench to leave a second portion of the nitride layer remaining over at least one active region of the semiconductor substrate forming an electrically isolating material over the semiconductor substrate after removing the first portion of the nitride layer, the electrically isolating material covering the nitride layer in the at least one active region of the semiconductor substrate and filling the at least one trench;

planarizing the electrically isolating material using a substantially self-stopping material removal process to expose a portion of the nitride layer in the at least one active region, and to provide a substantially planar top surface comprising the exposed portion of the nitride layer and a remaining portion of the electrically isolating material in the at least one trench, the remaining portion of the electrically isolating material forming an isolation structure in the at least one trench; and removing the remaining second portion of the nitride layer.

11. The method of claim 10, wherein removing the first portion of the nitride layer comprises removing about 200 Å or more and about 400 Å or less of material from the nitride layer using a wet etch process after forming the at least one trench.

12. The method of claim 10, wherein removing the first portion of the nitride layer after forming the at least one trench comprises leaving the remaining second portion of the nitride layer having a thickness of about 100 Å or more and about 300 Å or less.

13. The method of claim 12, wherein removing the first portion of the nitride layer after forming the at least one trench comprises leaving the remaining second portion of the nitride layer having a thickness of about 200 Å or more and about 300 Å or less.

14. The method of claim 10, wherein planarizing the electrically isolating material comprises removing a portion of the electrically isolating material using a fixed-abrasive chemical mechanical polishing process.

15. The method of claim 14, wherein the fixed-abrasive chemical mechanical polishing process comprises chemical mechanical polishing the electrically isolating material using a fixed-abrasive polishing pad and a slurry substantially free of abrasives.

16. The method of claim 10, wherein planarizing the electrically isolating material comprises:

removing at least a top portion of the electrically isolating material using a substantially self-stopping fixed-abrasive chemical mechanical polishing process; and removing a second portion of the electrically isolating material so as to expose the portion of the nitride layer in the at least one active region and the remaining portion of the electrically isolating material in the at least one trench.

17. The method of claim 16, wherein removing at least a top portion of the electrically isolating material comprises chemical mechanical polishing the electrically isolating material using a fixed-abrasive polishing pad and a slurry substantially free of abrasives.

18. The method of claim 17, wherein removing the second portion of the electrically isolating material comprises etching the second portion of the electrically isolating material using a wet etch process to expose the portion of the nitride layer in the at least one active region.

19. A method of providing shallow trench isolation between active regions in a semiconductor device, comprising:

forming a nitride layer to a thickness of about 100 Å or more and about 800 Å or less over a semiconductor substrate;

forming at least one trench through the nitride layer and the substrate in an isolation region of the substrate;

removing a first portion of the nitride layer after forming the at least one trench to leave a second portion of the nitride layer remaining over at least one active region of the substrate;

depositing an oxide material to fill the at least one trench and to cover the remaining portion of the nitride layer;

planarizing the oxide material so as to expose the remaining portion of the nitride layer, and to provide a substantially planar top surface comprising the exposed remaining portion of the nitride layer and a remaining portion of the oxide material in the at least one trench; and removing the remaining portion of the nitride layer.

20. The method of claim 19, wherein planarizing the oxide material comprises chemical mechanical polishing the oxide material using a fixed-abrasive polishing pad and a slurry substantially free of abrasives.

21. The method of claim 19, wherein forming the nitride layer comprises forming the nitride layer to a thickness of about 100 Å or more and about 500 Å or less over a semiconductor substrate.

22. The method of claim 19, wherein forming the nitride layer comprises forming the nitride layer to a thickness of about 100 Å or more and about 300 Å or less over a semiconductor substrate.

23. The method of claim 19, wherein forming the nitride layer comprises forming the nitride layer to a thickness of about 200 Å or more and about 300 Å or less over a semiconductor substrate.

24. A method of providing shallow trench isolation between active regions in a semiconductor device, comprising:

forming a nitride layer to a thickness of about 500 Å or more and about 800 Å or less over a semiconductor substrate;

forming at least one trench through the nitride layer and the substrate in an isolation region of the substrate;

removing a first portion of the nitride layer after forming the at least one trench to leave a second portion of the nitride layer remaining over at least one active region of the substrate;

depositing an oxide material to fill the at least one trench and to cover the remaining portion of the nitride layer;

planarizing the oxide material so as to expose the remaining portion of the nitride layer, and to provide a substantially planar top surface comprising the exposed remaining portion of the nitride layer and a remaining portion of the oxide material in the at least one trench; and removing the remaining portion of the nitride layer.

25. The method of claim 24, wherein removing the first portion of the nitride layer after forming the at least one trench comprises leaving the remaining second portion of the nitride layer having a thickness of about 100 Å or more and about 300 Å or less.

26. The method of claim 24, wherein removing the first portion of the nitride layer after forming the at least one trench comprises leaving the remaining second portion of the nitride layer having a thickness of about 200 Å or more and about 300 Å or less.

* * * * *

UNITED STATES PATENT AND TRADEMARK OFFICE
CERTIFICATE OF CORRECTION

PATENT NO.    : 6,613,646 B1  Page 1 of 1
DATED         : September 2, 2003
INVENTOR(S)   : Kashmir Sahota and Krishnashree Achuthan It is certified that error appears in the above-identified patent and that said Letters Patent is hereby corrected as shown below:

<u>Column 3,</u>
Line 22, please replace the numeral "11" with -- 1I --.

Signed and Sealed this

Twenty-eighth Day of October, 2003

JAMES E. ROGAN
*Director of the United States Patent and Trademark Office*